US008035422B2

(12) United States Patent
Wei

(10) Patent No.: US 8,035,422 B2
(45) Date of Patent: Oct. 11, 2011

(54) TRANSCONDUCTANCE AMPLIFIER WITH A FILTER FOR REJECTING NOISE OUTSIDE THE USEFUL BAND

(75) Inventor: James Wei, Grenoble (FR)

(73) Assignee: Commissariat A l'Energie Atomique, Paris (FR)

( * ) Notice: Subject to any disclaimer, the term of this patent is extended or adjusted under 35 U.S.C. 154(b) by 0 days.

(21) Appl. No.: 12/523,380

(22) PCT Filed: Jan. 15, 2008

(86) PCT No.: PCT/EP2008/050380
§ 371 (c)(1),
(2), (4) Date: Jan. 27, 2010

(87) PCT Pub. No.: WO2008/090053
PCT Pub. Date: Jul. 31, 2008

(65) Prior Publication Data
US 2010/0176882 A1 Jul. 15, 2010

(30) Foreign Application Priority Data
Jan. 16, 2007 (FR) ..................................... 07 00287

(51) Int. Cl.
*H02M 11/00* (2006.01)
*H03F 3/45* (2006.01)
(52) U.S. Cl. ............... 327/103; 327/94; 327/95; 327/96
(58) Field of Classification Search .................... 327/94, 327/96, 103
See application file for complete search history.

(56) References Cited
U.S. PATENT DOCUMENTS
6,262,677 B1 * 7/2001 Kiriaki et al. ................. 341/122

OTHER PUBLICATIONS

Tom Kwan and Ken Martin, An Adaptive Ananog Continuous-Time CMOS Biquadratic Filter, IEEE Journal of Solid-State Circuits, vol. 26, No. 6, Jun. 1991.
Bram Nauta, A CMOS Transconductance-C Filter Technique for Very High Frequencies, IEEE Journal of Solid-State Circuits, vol. 27, No. 2, Feb. 1992.
Rola A. Baki and Mourad N. El-Gamal, A 1V 0.8mW Multi-GHz CMOS Differential Tunable Image Reject Notch Filter, Circuits and Systems, USA 2005. Mikio Koyama, Tadashi Arai and Hiroshi Tanimoto, A 2.5-V Active Low-Pass Filter . . . Linear Input Range, IEEE Journal of Solid-State Circuits, vol. 28, No. 12, Dec. 1993.
Tom Kwan and Ken Martin, An Adaptive Ananog Continuous-Time CMOS Biquadratic Filter, presentation at IEEE Custom Integrated Circuits Conference, San Diego, 1991.
Tai Wook Kim, Bonkee Kim, Kwyro Lee, Highly Linear Receiver Front-End Adopting MOSFET . . . Gated Transistors, IEEE Journal of Solid-State Circcuits, vol. 39, No. 1, Jan. 2004.

* cited by examiner

*Primary Examiner* — Lincoln Donovan
*Assistant Examiner* — John Poos
(74) *Attorney, Agent, or Firm* — LaRiviere, Grubman & Payne, LLP

(57) ABSTRACT

The invention relates to a transconductance amplifier, providing current variations di=k·dv when it receives voltage variations dv.
The amplifier comprises a first MOS transistor (MN4) whose drain provides differential currents (I−di, I+di). It comprises an output stage having a second transistor (MP5) of a type opposite to the first, whose source is linked to the drain of the first, whose gate is biased at a constant potential (Vref), and whose drain receives the current variations which are provided by the first transistor and which must be applied to a sampling capacitor. The amplifier furthermore comprises a filter (FLT) with frequency response centered on the central frequency Fo of the signals to be converted, having a very high impedance around this central frequency and a low impedance outside the useful spectrum, the filter being connected to the source of the second transistor (MP5) so as to divert away from the second transistor the current variations which are in a frequency band situated outside the useful spectrum.

4 Claims, 2 Drawing Sheets

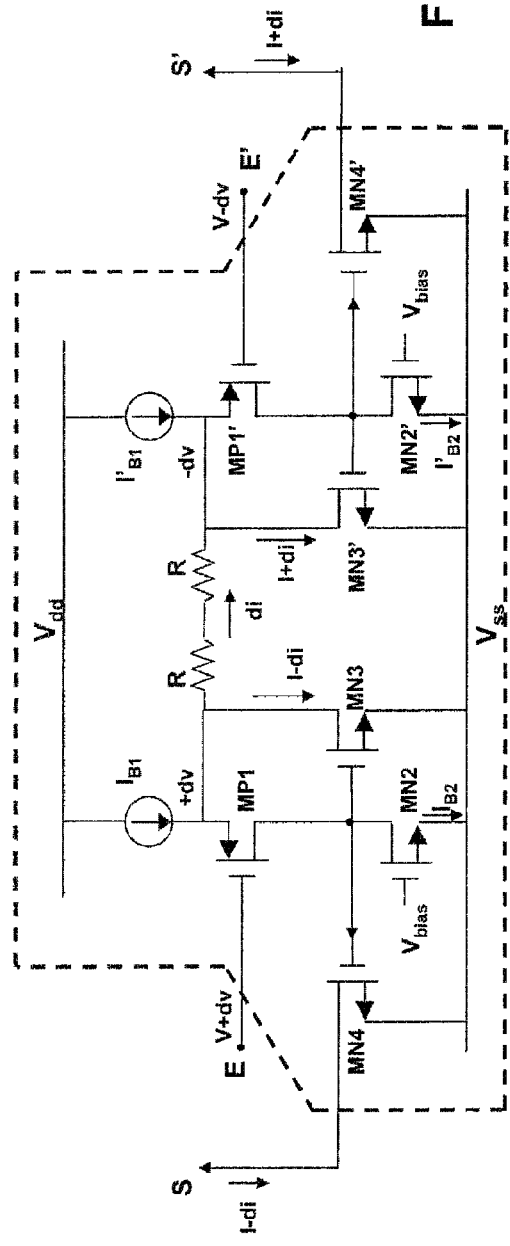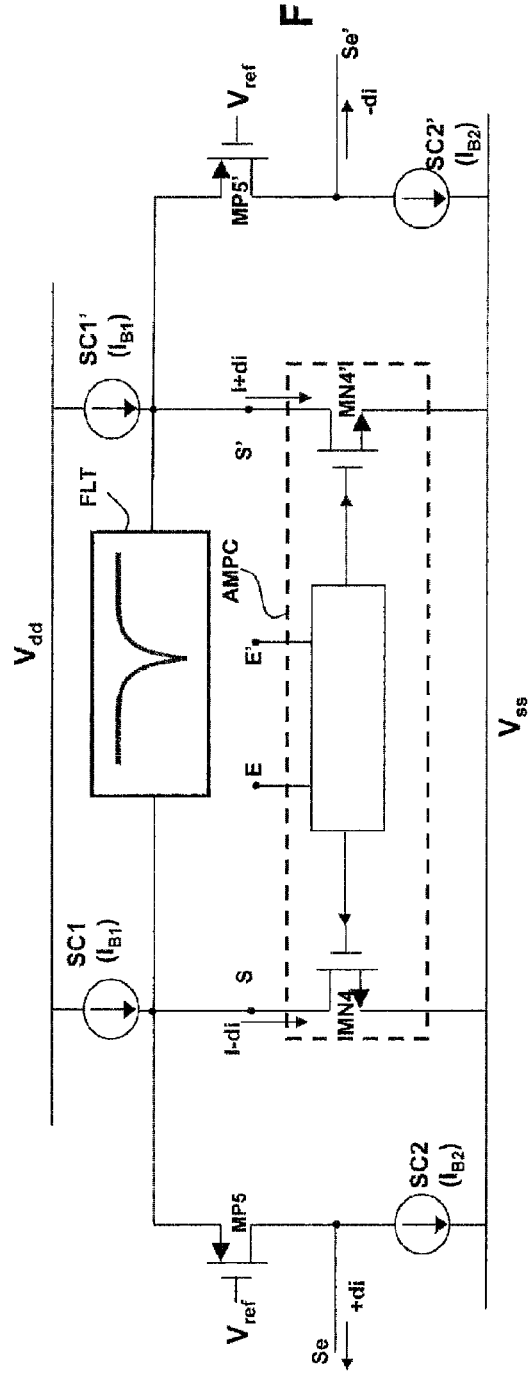

TRANSCONDUCTANCE AMPLIFIER WITH A FILTER FOR REJECTING NOISE OUTSIDE THE USEFUL BAND

PRIORITY CLAIM

This application claims priority to PCT Patent Application No. PCT/EP2008/050380, entitled Transconductance Amplifier With A Filter For Rejecting Noise Outside The Useful Band, filed on Jan. 15, 2008.

FIELD OF THE INVENTION

The invention relates to a transconductance amplifier, intended to provide current variations di when it receives voltage variations dv, doing so with a desired conversion coefficient Gm called the transconductance: Gm=di/dv The invention is applicable most particularly for embodying certain types of sample-and-hold units, more precisely those which operate by sampling a quantity of charges rather than a spot voltage value. Moreover, the invention applies not only to circuits intended to convert a simple voltage variation into a simple current variation, but also to differential circuits intended to convert a differential voltage variation into a differential current variation.

BACKGROUND OF THE INVENTION

To pinpoint the context of this invention, it may be recalled that it is sometimes preferred to sample charges rather than voltages, so as to reduce the influence of the clock noise (sometimes also called clock jitter) when one wishes to sample a high-frequency signal under the control of a clock which defines the periodic-sampling phases. By integrating not a voltage level in a sampling capacitor but a current for a known sampling duration, the influence of this clock noise is reduced. But, as the input signal to be converted generally takes the fowl of a voltage (or more exactly of high-frequency voltage variations), it is necessary to place upstream of the sampling capacitor or capacitors a high-quality transconductance amplifier which will convert the voltage variations very precisely into current variations.

Sample-and-hold units using a transconductance amplifier at the input stage are employed notably in applications of sampling telecommunications signals at high frequency with a view to a frequency transposition followed by an analog-digital conversion of the signals. The frequency bands of telecommunications signals are very congested. A telecommunications channel uses a narrow frequency band and everything arising outside of this band constitutes nuisance noise. Generally, the telecommunications signal sent on a given channel comprises a useful spectrum centered on a carrier frequency Fo. The carrier with frequency Fo is amplitude modulated or frequency modulated and one of the aims of the sampling is in particular to transpose the signal to an intermediate-frequency spectrum (centered on an intermediate frequency Fi which is lower than Fo) or even to a baseband spectrum (centered on a zero frequency).

Now it is known that the sampling, at a sampling frequency Fe, of a signal whose useful spectrum is centered on a frequency Fo produces on the one hand a useful spectrum in a transposed band centered on an intermediate frequency Fi=Fe−Fo, but also produces in this transposed band what is called noise spectrum aliasings; this aliased noise originates not only from the noise present in the useful band centered on Fo, but also from the noise present in bands of the same width centered on Fi+Fe, or indeed on other bands still related to the harmonics of Fe, such as a band centered on KFe+Fi or KFe−Fi, K being an integer. All these varieties of noise are aliased towards the new useful signal band centered on the intermediate frequency Fi, and the resulting noise is the sum of the aliased noise since the noise arising from the various bands is uncorrelated and remains uncorrelated after aliasing.

If a filter were placed at the input of the sample-and-hold unit, this would eliminate part of the noise, but this would not eliminate the inherent noise of the input amplifier of the sampler. If filtering is done at the output, it is too late, the aliased noise is already in the useful output passband.

In practice, it would be necessary to filter actually inside the input amplifier of the sampler. Unfortunately, most input amplifier structures do not allow such filtering internal to the amplifier without degrading the performance of the amplifier.

By way of example, the article by B. Nauta "A CMOS transconductance-C Filter Technique for Very High Frequencies" in IEEE Journal of Solid-State Circuits, vol 27 No. 2 pp 142-153 February 1992 describes a transconductance amplifier structure which has good passband characteristics but correlatively high noise and it does not easily enable filtering of this noise.

Another example is given in the article by M. Koyama et al., "A 2.5-V Active Low-Pass Filter Using All-n-p-n Gilbert Cells with a 1-Vp-p Linear Input Range" in IEEE Journal of Solid State Circuits, vol. 28, no. 12, pp 1246-1253, December 1993. This involves a two-stage amplifier which can support internal filtering, but which exhibits distortion.

In still another example, T. Kwan and K. Martin., "An adaptive analog continuous-time CMOS biquadratic filter", in IEEE Journal of Solid State Circuits, vol. 26, no. 6, pp 859-867, June 1991, the introduction of an internal filter would disturb the useful signals.

It has been found that it was possible to modify the structure of the output stage of a transconductance amplifier intended to be placed at the input of a sample-and-hold unit, so as to introduce thereinto an internal filtering fulfilling in the best possible way a function for eliminating the noise which is engendered by aliasing during the sampling performed downstream.

The output stage is constituted according to the invention as a folded cascode stage absorbing the whole of the current produced by the transconductance amplifier and it is to this folded cascode stage that a filter is linked which is capable of diverting the current variations which are not in the useful frequency band of the input signal to be sampled, without diverting the current variations which are in the useful band. The filter has a high impedance in the useful band centered around the frequency Fo of the carrier.

SUMMARY OF THE INVENTION

Consequently, the invention proposes a transconductance amplifier comprising a first transistor of a first type providing current variations to be sampled having a useful frequency spectrum centered on a frequency Fo, characterized in that it comprises an output stage comprising a second transistor of a type opposite to the first, whose source is linked to the drain of the first, whose gate is biased at a constant potential, and whose drain receives the current variations which are provided by the first transistor and which must be applied to a sampling capacitor, and in that it furthermore comprises a filter with frequency response centered on the central frequency Fo of the input signals of the amplifier, having a very high impedance around this central frequency and a low impedance outside the useful spectrum, the filter being connected to the source of the second transistor so as to divert away from the second transistor the current variations which are in a frequency band situated outside the useful spectrum.

In practice, the variations in current to be sampled are superimposed on a bias current equal to the sum of a first and of a second constant current. The second transistor has its source linked to a first current source providing a current equal to the first constant current. Its drain is linked to a current output of the amplifier and to a second current source providing a current equal to the second constant current.

The amplifier according to the invention is most particularly intended to be placed at the input of a sample-and-hold unit with a view to the conversion into current variations of high-frequency voltage signals having a useful spectrum centered on a frequency Fo, before these current variations are sampled.

The amplifier thus designed is simple or differential; if it is differential, it consists of two simple amplifiers and the filter is connected between the drains of the first respective transistors of the two simple amplifiers.

The filter can be a simple passive filter with inductor and capacitor.

By virtue of the invention, it is possible to embody a low-noise sample-and-hold unit of very large passband.

It will be noted that the amplifier according to the invention can be embodied with MOS transistors or with bipolar transistors, and consequently, throughout this description, it will be considered that the term "transistor" covers both MOS transistors and bipolar transistors and that the terms "source", "drain", and "gate", conventionally used for MOS transistors, should be interpreted as signifying respectively "emitter", "collector" and "base", if the transistors are bipolar. MOS transistors of opposite type are then NMOS and PMOS transistors, bipolar transistors of opposite type are NPN and PNP transistors respectively.

BRIEF DESCRIPTION OF THE DRAWINGS

Other characteristics and advantages of the invention will become apparent on reading the detailed description which follows and which is given with reference to the appended drawings in which:

FIG. 1 represents a known exemplary transconductance amplifier on the basis of which the present invention can be applied;

FIG. 2 represents the transconductance amplifier according to the invention;

DESCRIPTION OF PREFERRED EMBODIMENTS

Figure 3:
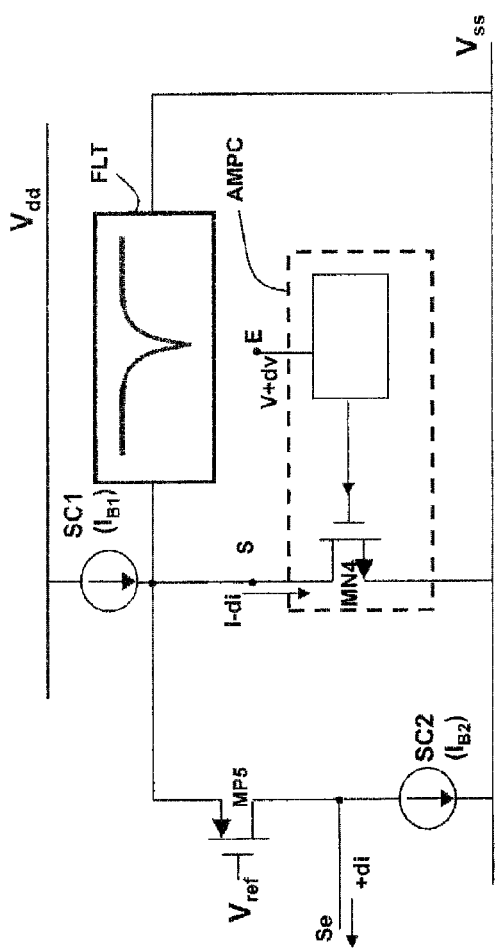
FIG. 3 represents the amplifier according to the invention for a non-differential mode.

The transconductance amplifier of FIG. 1 is a differential amplifier having two inputs E, E' between which is applied a differential input voltage (as small high-frequency signals) V+dv, V−dv, to be converted into differential current I−di, I+di on two differential current outputs S and S'. V is a common-mode voltage on the inputs, I is an identical bias current on the two outputs.

The amplifier is symmetric since here differential working is involved and therefore comprises two identical halves. The first half comprises a series assembly of a first and a second MOS transistor (MP1, MN2) of opposite type linked by their drains; the gate of the first transistor MP1 is linked to the input E; the source is linked to a constant current source $I_{B1}$ as well as to a resistor of value R and to the drain of a third MOS transistor MN3 of the same type as the second; the source of the second transistor MN2 and that of the third transistor MN3 are grounded (Vss); the gate of the transistor MN3 is linked to the drains of the first and second transistors; and the amplifier furthermore comprises a fourth transistor MN4 whose function is to copy over to the output S the current which traverses the transistor MN3; the sources of the second and fourth transistors, MN2 and MN4 are therefore linked, as are their gates. Finally, the gate of the transistor MN2 is biased by a fixed voltage $V_{bias}$ so that this transistor acts as current source and maintains a very fixed value of current, of value $I_{B2}$, in the transistors MP1 and MN2. The other half of the amplifier consists of an identical assembly of four transistors, designated by the same references labeled with the sign 'prime', and hooked up in the same manner between the input E' and the output S'; the current sources are identical in the two amplifier halves, as are the resistors and also the constructions of transistors. The resistors of value R are linked together and constitute a single resistor of value 2R shared between the two halves of the amplifier; this resistor of value 2R in fact links the drains of the third transistors MN3, MN3' of the two assemblies.

This layout ideally operates in the following manner: the transistor MP1 traversed by a constant current is a voltage follower; the small variations dv on its gate are passed on in full to its source. The same holds for MP1', with an opposite variation (−dv). The resistor of value 2R sees a voltage variation 2 dv at its terminals. It is traversed by a current variation di=2 dv/2 R=dv/R which cannot flow either in the branch $I_{B1}$ or in the transistors MP1, MN2, MP1', MN2' whose currents are fixed at $I_{B2}$. The current variation 2 dV/R can flow only in the transistors MN3 (in one sense) and MN3' (in the opposite sense). In practice a current I−di flows in the transistor MN3 and a current I+di flows in the transistor MN3', where the common bias current I is simply $I_{B1}-I_{B2}$.

The currents I−di and I+di are copied by the transistors MN4 and MN4' to constitute the differential output currents I−di=I−dv/R in one sense on S, and I+di=I+dv/R in the opposite sense on S'. The amplifier therefore has a transconductance di/dv equal to 1/R for small signals; this transconductance is well controlled and very linear. The simplifying assumption is made that the current is copied over with a factor 1. It will be understood that this factor could be different by choosing a ratio of geometries different from 1 between the transistors MN3 and MN4.

FIG. 2 represents the basic layout of the present invention. The core of the transconductance amplifier of FIG. 1, surrounded by a dashed line, is employed to form the circuit according to the invention. It is designated by AMPC in FIG. 2 (in dashed lines also) and it possesses two differential voltage inputs E and E' and two differential current outputs S and S' as explained previously.

The core of the amplifier is followed, on each output, by an output stage termed a "folded cascode stage", the function of which is to restore a current di on the basis of the current I+di and a current −di on the basis of the current I−di, with a view to applying these currents in principle to a sampling capacitor. The assembly of the transconductance amplifier, sampling capacitor or capacitors, and sampling switches with their control circuits (not represented in FIG. 2) will then constitute a complete sampling circuit.

The folded cascode output stage which is connected to the output S comprises a transistor MP5 (PMOS) identical to the transistor MP1 of the core AMPC and whose source is linked to the output S, therefore to the drain of the transistor MN4.

The function of this transistor is to eliminate a part of the component of current I, present on the drain of MN4. It is recalled that the component I is equal to $I_{B1}-I_{B2}$. The cascode stage therefore comprises current sources SC1 and SC2 which establish respectively currents $I_{B1}$ and $I_{B2}$ that it will be possible to subtract from the current I.

The transistor MP5 is arranged so as to divert the current variations di arising from the core AMPC towards an output Se which will now comprise only the current di and not the current I−di.

The two current sources SC1 and SC2 of the same values $I_{B1}$ and $I_{B2}$ as the sources of the core AMPC are connected in the following manner: the source of MP5 is linked to the output S and also to the current source SC1 ($I_{B1}$) which takes its power supply from Vdd. The drain of MP5 is linked to the current source SC2 ($I_{B2}$) which directs its current towards the ground Vss. The gate of the transistor MP5 is at a fixed bias potential Vref.

The output of the cascode stage is a node Se and represents the output of the transconductance amplifier supplemented with its output stage; in a sampler, the output Se is intended to be linked to a sampling capacitor by way of a switch or a system of switches.

The arrangement and the numerical and geometric parameters are rigorously the same for the other half of the amplifier; the elements bear the same references with the sign "prime".

The output stage operates in the following manner: since the output S provides a current I−di which is equal to $I_{B1}-I_{B2}-di$, and on account of the presence of the current source SC1 providing $I_B$, the current which flows in the transistor MP5 is necessarily equal to $I_{B1}-(I_{B1}-I_{B2}-di)$ therefore to $I_{B2}+di$.

Also, on account of the presence of the source SC2 which provides $I_{B2}$, the final output current of the transconductance amplifier is an outgoing current of value+di on the output Se. In the same manner, it is an outgoing current of value−di on the output Se'.

Thus having constituted two current outputs of value di and−di on the outputs Se and Se', a narrowband filter FLT intended to eliminate the noise upstream of the sampling is placed between the nodes S and S', that is to say inside the transconductance amplifier itself since it is upstream of the final outputs Se and Se'.

This filter has the following properties: its curve of impedance variation as a function of frequency is centered on the central frequency Fo of the signals to be converted; it has a very high impedance around this central frequency and a low impedance outside the useful spectrum of the signals to be transmitted, that is to say a low impedance outside of a relatively narrow band around the central frequency. Such a filter can quite simply be an entirely passive tank circuit (an inductor in parallel with a capacitor, complying with the condition $2\pi LCFo^2=1$). More sophisticated filters can be envisaged if a more rectangular filtering template than that of a simple LC filter is desired.

The filter is connected between the outputs S and S', therefore between the drains of the transistors MN4 and MN4', so as to divert outside of the transistor MP5 the current variations which would be in a frequency band situated outside the useful spectrum. In other words, the filter FLT tends to short-circuit the drains of the transistors MN4 and MN4' for the non-useful frequencies (and notably the noise situated outside the useful spectrum), so that the currents di and−di, for the non-useful frequencies, tend to pass from the drain of the transistor MN4 to the drain of the transistor MN4' rather than to the outputs Se and Se'. Conversely, for the useful frequencies around Fo, the filter behaves as an open circuit and does not prevent the current variations di from being directed towards the output Se or Se'.

It will be noted that this layout is completely transposable to a non-differential arrangement in which the transconductance amplifier uses only a half of the layout of FIGS. 1 and 2. Such an arrangement is represented in FIG. 3. The core AMPC of the transconductance amplifier comprises half the layout of FIG. 1, the elements assigned the sign 'prime' being omitted. There is a single input E for receiving a voltage V+dv to be converted into current and a single output S for providing a current I−di where I is equal to $I_{B1}-I_{B2}$. The output stage of the transconductance amplifier comprises only the transistor MP5 and the sources SC1 and SC2. The final output is the output Se providing a small-signal current di where di=dv/R.

In this case, the filter FLT is connected between the output S and the low potential of the power supply (ground Vss). Operation is the same as for differential: for the useful frequency spectrum centered on the central frequency Fo of the signals to be converted, the filter exhibits a very high impedance and does not play any role. For the frequencies outside of the useful band, the filter tends to short-circuit the current di towards the ground, so that it does not exit through the output Se.

Figure 4:
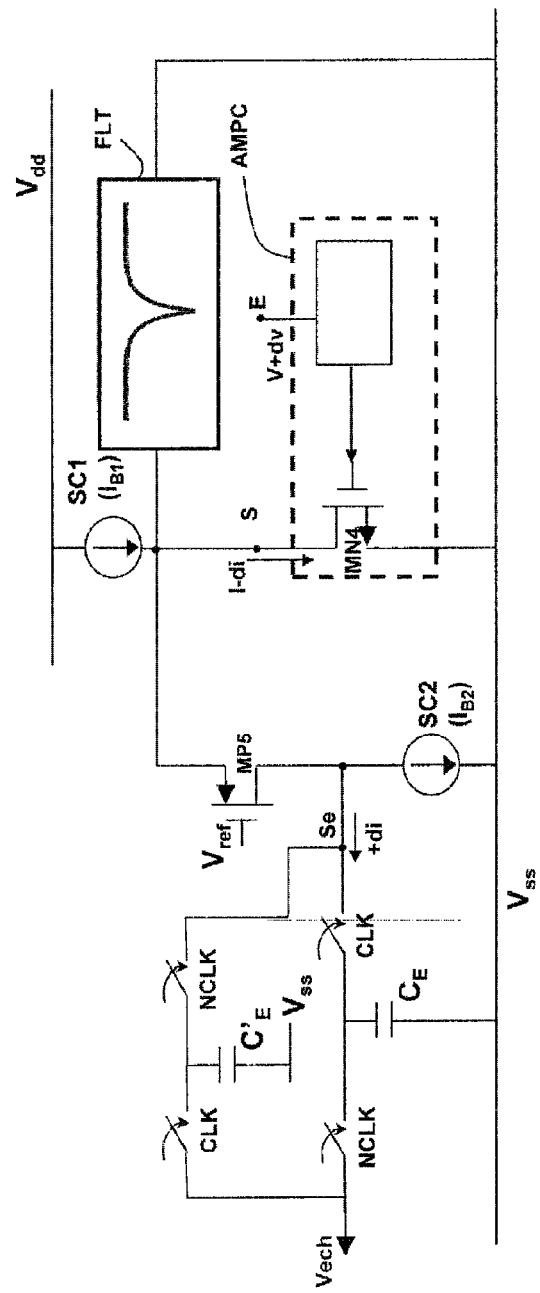
FIG. 4 represents an application of the transconductance amplifier of FIG. 3 to a simplified layout of a differential sample-and-hold unit.

FIG. 4 represents a simplified layout for using the transconductance amplifier to embody a sampler. The layout considered by way of example is a non-differential application so as to simplify the representation, but it is obviously transposable to a differential application using for example (but not necessarily) two separate sampling capacitors.

The voltage to be sampled, dv as small signals, which is applied to the input E, is converted into a current di on the output Se by the transconductance amplifier which is that of FIG. 3. This current di is integrated in a sampling capacitor $C_E$ for the duration of a first half-alternation CLK of a pulse of a sampling clock and stores a sample of charges in the capacitor $C_E$. For the duration of the following half-alternation NCLK, the output Se is disconnected from the capacitor $C_E$ and the latter is linked to a sampled voltage output Vech which can be utilized, for example applied to an analog-digital converter.

To increase the sampling rate, provision may very well be made, but this is not compulsory, for another sampling to take place during the following half-alternation NCLK, in a capacitor $C'_E$ identical to the capacitor $C_E$. Thus, the current di to be sampled is applied alternately to the capacitor $C_E$ and to the capacitor $C'_E$ and while the voltage of one is read and utilized, the other receives the current to be sampled. The capacitors are reset to zero after each utilization in the case of simple sampling without decimation, that is to say without adding series of N samples in the same capacitor. The reset to zero breakers are not represented so as not to overburden the layout.

The transconductance amplifier according to the invention can be used in a sample-and-hold unit intended for an analog-digital conversion, in simple or in differential mode, and notably in a sample-and-hold unit providing two phase quadrature samples at each sampling period (this entailing double the number of sampling capacitors). It can also be used in a finite impulse response sampled filter, in which a weighted sum of a succession of N samples of current di is performed and samples are provided at a reduced frequency or decimation frequency which is the sampling frequency divided by N.

It will be noted that the transconductance amplifier principle according to the invention has been described in regard to an amplifier core which is that of FIG. 1, but that it is applicable to other amplifier core layouts, for example a layout in which the transistor MN2 had its gate connected not to a fixed bias voltage Vbias but to the gate of the transistor MP1. The only condition to be complied with is that the transconductance amplifier core provides a current I−di or I+di whose component I is known to be able to be neutralized by the current sources SC1 and SC2 of the folded cascode transistor arrangement. It is then desirable for the source SC2 to be replaced with an NMOS transistor whose gate is brought to the same potential as the gate of MPS, this potential being such that the current in the transistor thus added is the same current $I_{B2}$ as that which forms a component of I, that is to say the same current $I_{B2}$ as that which flows in the transistor MN2 of the core AMPC.

Throughout the foregoing, the MOS transistors can be replaced with bipolar transistors as has been indicated.

The invention claimed is:

1. A sample and hold device comprising:
 1. a first transconductance amplifier for receiving voltage variations and providing corresponding current variations to be sampled, and a first associated sampling capacitor and a first switching system, the first transconductance amplifier comprising:
    a. a first transistor of a first type having a first drain for providing current variations to be sampled, the current variations having a useful spectrum centered on a frequency Fo;
    b. a second transistor of a type opposite to the first type, the second transistor having:
       i. a source connected to the first drain;
       ii. a gate biased at a constant potential;
       iii. a second drain, connected to the switching system, second drain providing the current variations to the sampling capacitor; and
    c. a filter with a frequency response centered on the central frequency Fo of the current variations, wherein the filter:
       i. has a very high impedance around this central frequency and a low impedance outside the useful spectrum; and
       ii. is connected to the source of the second transistor enabling the filter to divert the current variations, which are in a frequency band situated outside the useful spectrum, away from the second transistor.

2. The sample and hold device as claimed in claim 1, wherein the filter is connected moreover to a supply potential.

3. A sample and hold device according to claim 1, comprising:
    a. a second transconductance amplifier identical to the first transconductance amplifier and including a respective transistor of the first type;
    b. a second associated sampling capacitor;
    c. a second associated switching device; and
    d. wherein the filter is connected between the drains of the respective first transistors of the first and second transconductance amplifiers.

4. The sample and hold device as claimed in one of claims 1 to 3, wherein the filter is a passive filter comprising an inductor and a capacitor.

* * * * *

UNITED STATES PATENT AND TRADEMARK OFFICE
CERTIFICATE OF CORRECTION

PATENT NO. : 8,035,422 B2  Page 1 of 1
APPLICATION NO. : 12/523380
DATED : October 11, 2011
INVENTOR(S) : James Wei It is certified that error appears in the above-identified patent and that said Letters Patent is hereby corrected as shown below:

In the Specification:
Column 1, line 38, delete "fowl" and replace with --form--.
Column 5, line 31, delete "$I_B$," and replace with --$I_{B1}$,--.
Column 7, line 9, delete "MPS" and replace with --MP5--.

Signed and Sealed this
Twenty-ninth Day of January, 2013

David J. Kappos
*Director of the United States Patent and Trademark Office*